United States Patent [19]
Preston

[11] Patent Number: 4,798,439
[45] Date of Patent: Jan. 17, 1989

[54] OPTICAL COMPONENT MOUNTING

[75] Inventor: Keith Preston, Ipswich, England

[73] Assignee: British Telecommunications, plc, London, England

[21] Appl. No.: 842,230

[22] Filed: Mar. 21, 1986

[30] Foreign Application Priority Data

Mar. 29, 1985 [GB] United Kingdom ............... 8508280

[51] Int. Cl.⁴ .............................................. G02B 6/26
[52] U.S. Cl. .................................. 350/96.20; 357/81; 350/320
[58] Field of Search ............... 350/96.10, 96.11, 96.12, 350/96.13, 96.14, 96.15, 96.20, 320, 330, 331 R, 331 T, 351; 250/227; 357/17, 19, 30, 72, 74, 81; 372/6, 34, 35, 36

[56] References Cited

U.S. PATENT DOCUMENTS

| | | | |
|---|---|---|---|
| 3,289,046 | 11/1966 | Carr | 357/75 |
| 4,083,054 | 4/1978 | Moraw et al. | 219/497 |
| 4,136,357 | 1/1979 | Frederiksen | 357/72 |
| 4,237,474 | 12/1980 | Ladany | 357/81 |
| 4,399,541 | 8/1983 | Kovats et al. | 372/36 |
| 4,456,334 | 6/1984 | Henry et al. | 350/320 |
| 4,460,915 | 7/1984 | Engel | 357/74 |
| 4,523,802 | 6/1985 | Sakaguchi et al. | 350/96.12 |
| 4,561,006 | 12/1985 | Currie | 357/75 |
| 4,589,732 | 5/1986 | Shiraishi et al. | 350/331 R |
| 4,685,766 | 8/1987 | Nishimura et al. | 350/96.10 |

FOREIGN PATENT DOCUMENTS 0126003 11/1984 European Pat. Off. .
3307466 9/1984 Fed. Rep. of Germany .

Primary Examiner—William L. Sikes
Assistant Examiner—Frank González
Attorney, Agent, or Firm—Nixon & Vanderhye

[57] ABSTRACT

An improved technique for mounting optical components on a substrate comprises providing each component with a dedicated heating element on the component itself to permit controlled and well-localized heating of solder on the substrate during fixing. In the example illustrated the optical component is an optical fibre carrier comprising fibre (10), carrier plate (12) and heating element (20), which itself comprises an ink film resistor (22) deposited on a ceramic chip (21) having metallized electrical contacts (23).

13 Claims, 3 Drawing Sheets

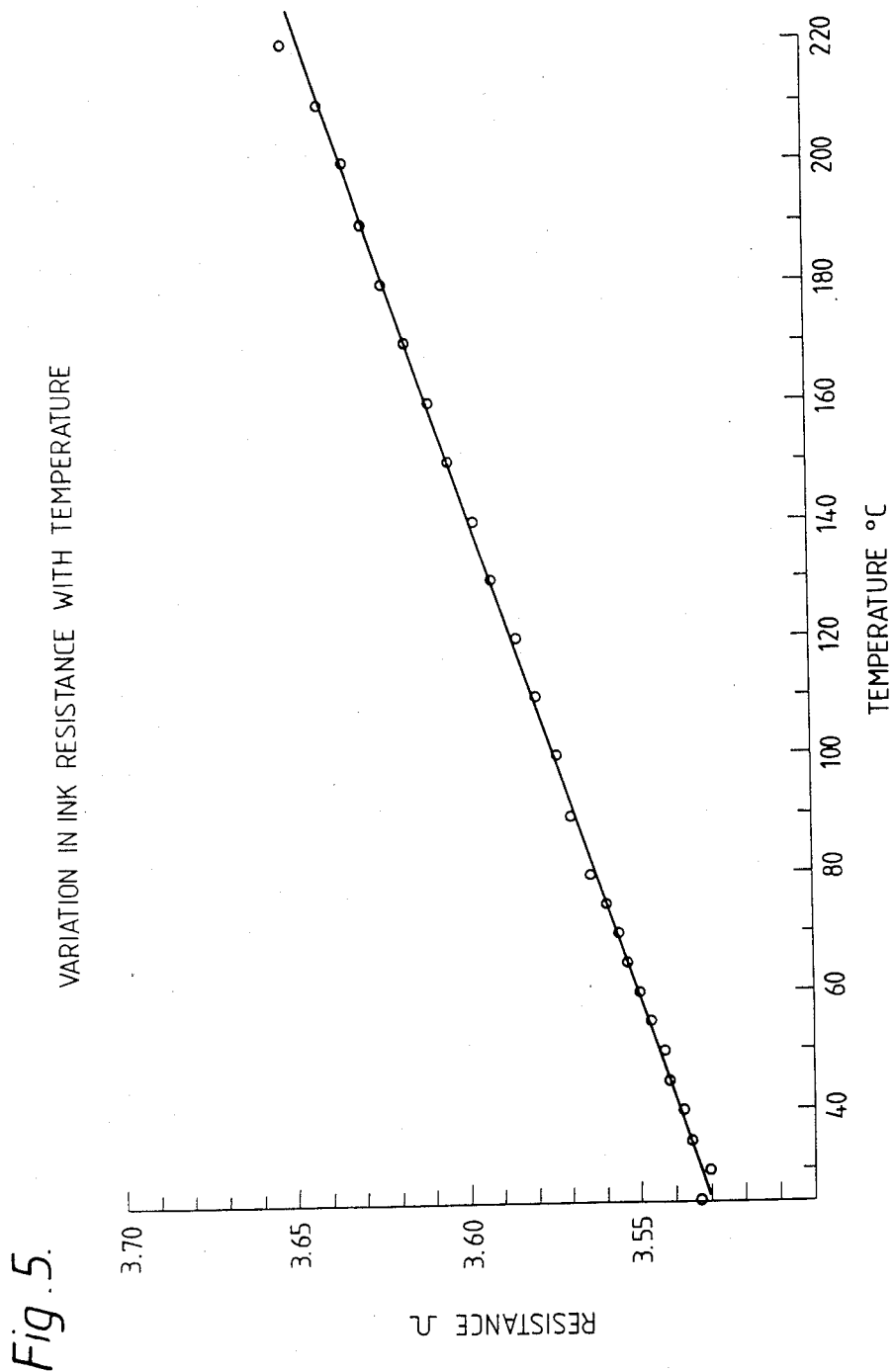

OPTICAL COMPONENT MOUNTING

FIELD OF THE INVENTION

This invention relates to optical components and methods of mounting optical components. The invention has an important application in the field of assembling optical devices for optical communication systems.

BACKGROUND AND SUMMARY OF THE INVENTION

The importance of achieving accurate mutual alignment of individual components in any optical system is well known. The miniature dimensions of components used in modern optical communication systems render such alignment very difficult both to achieve and to maintain. For example, one of the main problems in the construction of semiconductor laser transmitters is that of efficiently coupling the optical power from a semiconductor laser diode into a monomode fibre. To obtain efficient coupling, the fibre end must be very precisely aligned with the emitting area of the laser facet. When such alignment is achieved, the fibre must then be fixed in place, ideally by a method which ensures that alignment is sustained throughout the device lifetime.

In the past various methods of mounting have been proposed or employed in an effort to meet the required demands of accuracy and longevity of alignment. Traditionally, components have been fixed by soldering. However, where a number of separate components are to be mounted on the same substrate a series of solders must usually be used, with each successive component being fixed with a progressively lower melting point solder. The first mounted components are not then loosened when others are fixed subsequently. Nevertheless, there are obvious problems if it is necessary, for maintainance purposes, for example, to remove a first mounted component, fixed with a high melting point solder, without disturbing those later mounted components, fixed with lower melting point solders.

Some methods of restricting the applied soldering heat to the immediate locality of a component have been tried in an attempt to avoid the problems involved in the use of a series of solders. Such methods include the use of a hot gas jet, or direct thermal conduction from a heated clamp. However, because of drawbacks including difficulties in ensuring adequate heat transfer and, more significantly, the difficulty of avoiding alignment perturbations, these techniques have generally proved unsatisfactory, even for laboratory applications.

The adoption of organic adhesives has been successful for fixing some components, but such adhesives are not generally acceptable for several reasons. Firstly, component replacement is considered difficult, if not wholly impractical. Secondly, during aging, adhesives may be subject to shrinkage, with the likelihood of adverse consequences on component alignment. Thirdly, also with ageing, adhesives are liable to outgas undesirable organic substances. Enclosed in component packages, such as, for example, a laser transmitter, these substances can cause severe degradation and premature failure of the components.

It is one object of the present invention to provide a method of mounting optical components, which permits some of the above disadvantages to be overcome or mitigated.

It is a second object of the present invention to provide an improved optical component adapted to facilitate mounting by the improved method.

According to the present invention there is provided a method of mounting an optical component on a substrate, the method comprising providing a component with dedicated heating means and fixing the component to the substrate with solder, wherein the component and solder are heated locally by the dedicated heating means.

Preferably the temperature of the heating means is electrically controlled.

Conveniently, the heating means comprises a resistive heating element.

The heating means may be provided by bonding or otherwise affixing a miniature resistor to the component.

Alternatively, the heating means may be provided by deposition of a resistive ink film on a suitably insulated surface on the component. The insulated surface may be a ceramic layer. Metallised contacts may be provided to allow simple electrical connection to the resistive film.

According to a second aspect of the present invention, an optical component comprises dedicated heating means to facilitate solder mounting of the component.

The heating means may be a resistive ink film deposited on an insulating surface on the component, and the resistive film may have metallised contacts for electrical connections.

BRIEF DESCRIPTION OF THE DRAWINGS

The present invention will now be described by way of example and with reference to the accompanying drawings, in which;

FIG. 5 is a graph of the change in resistance with temperature of a heating element (of the type shown in the FIG. 2 inset).

DETAILED DESCRIPTION

A conventional method of mounting will first be described with reference to FIG. 1. The mounting of an optical fibre carrier on a semiconductor laser submount is taken as an example.

Figure 1:
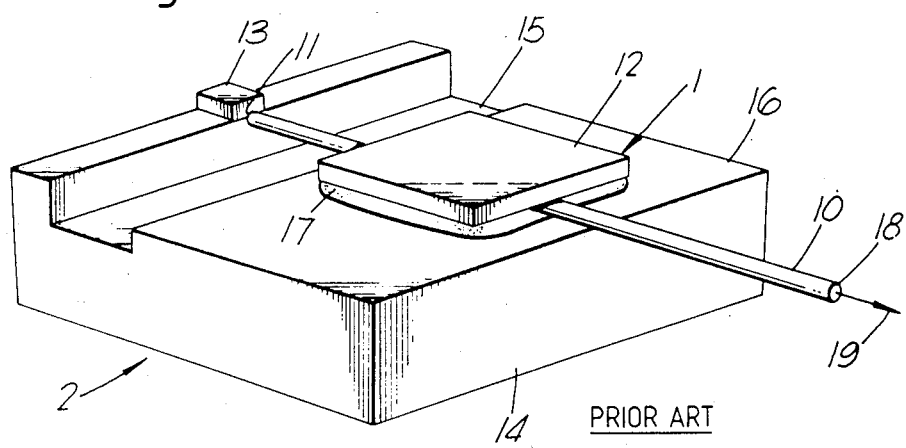
FIG. 1 is a schematic illustration of the prior art, showing an optical fibre carrier, conventionally prepared and mounted on a semiconductor laser submount.

FIG. 1 shows an optical fibre 10 attached to a carrier plate 12, forming an optical fibre carrier assembly 1. A laser submount 2 comprises a semiconductor laser 13, mounted on a copper submount 14. Such a submount may typically have dimensions of approximately 6 mm×4 mm×1.5 mm.

A groove 15 is provided in the submount 14 so that solder 17 used to fix the fibre carrier assembly onto the stage 16 of submount 14 is prevented from contacting the laser 13.

During the mounting process the submount assembly 2 is placed on a temperature controlled heating platform (not shown) and its temperature is raised to slightly above the melting point of the solder to be used. (For normal indium-based solder, this temperature is around 118° C.). Solder 17, which may be in the form of a preform or solder paste, is then applied to the stage 16. The fibre carrier assembly 1, held in a clamp attached to a precision manipulator stack (not shown), is then lowered onto the molten solder.

The fibre end 11 must next be optically aligned with the emitting area of the laser 13. Conventionally, this is done by operating the laser under low duty-cycle pulsed conditions, and manipulating the fibre carrier so as to maximise the optical power coupled into the fibre. A sophisticated detector 19 must be provided to monitor the light which emerges (in the direction arrowed) from the remote end 18 of the fibre 10. The alignment position is optimal where the power of the transmitted light is a maximum.

When the fibre is in alignment with the laser, the temperature of the heating platform is lowered to allow the solder to solidify and so fix the fibre in position. Finally, the fibre carrier assembly 1 can be released from its clamp (not shown). The completed arrangement is then as illustrated in FIG. 1.

Component modification and mounting according to the present invention will now be described, also with regard to the mounting of an optical fibre carrier onto a laser submount, and with reference to FIGS. 2 to 5.

Figure 2A:
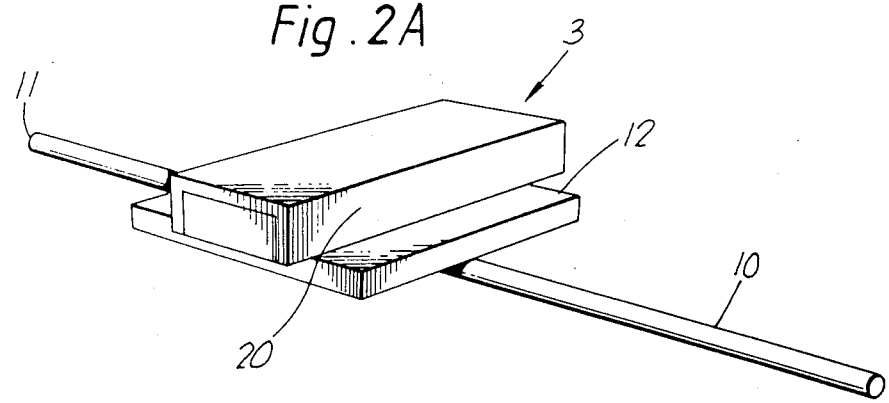
FIG. 2A shows schematically an optical fibre carrier adapted according to the second aspect of the present invention.
Figure 2B:
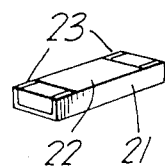
FIG. 2B illustrates a resistive heating element which forms the heating means 20 in FIG. 2A.

FIG. 2A shows a fibre carrier assembly 3, modified in accordance with the invention to incorporate a suitable heating element 20 as a heating means as is shown in more detail in FIG. 2B. The heating element shown in FIG. 2B is a so-called chip resistor. Chip resistors of this form are commercially available, and comprise a ceramic substrate 21, with a layer of resistive ink 22 deposited on one face. Electrical contact is made via the metallised contacts 23 on each end. The ink is usually covered with an electrically insulating glaze. An additional metallic surface (not shown), isolated from the ink, may also be provided so that the resistor can be attached to the component with a suitable high temperature solder prior to mounting. Alternatively, where appropriate, the resistor may be attached by fusing a glass frit, for example. The chip resistor is usually attached with its resistive face next to the carrier plate 12 for best heat conduction.

Resistance values for the chip resistor of between 1 and 10 ohms have been found particularly convenient for use according to the present invention.

Figure 3:
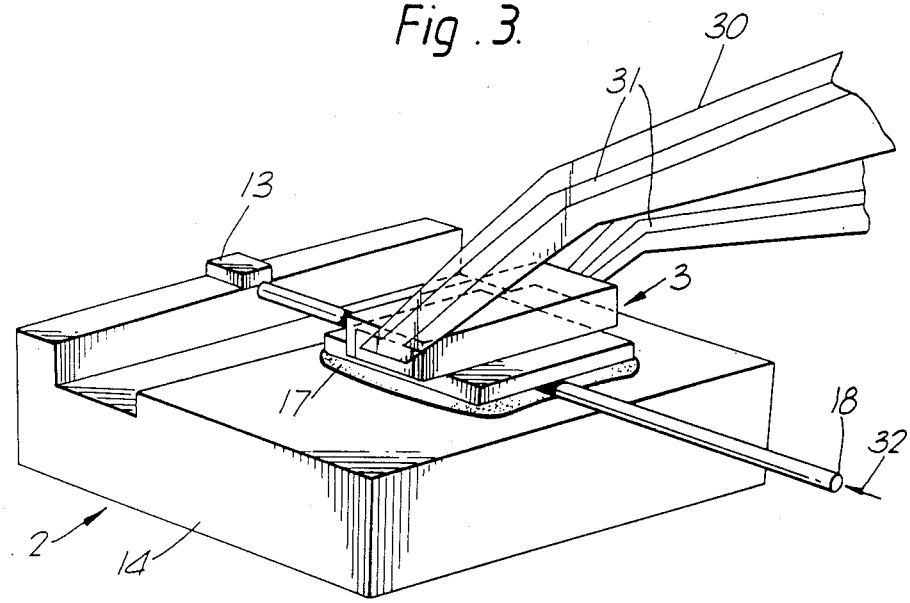
FIG. 3 illustrates schematically the mounting of the modified carrier onto a laser submount by a method according to the present invention.

In mounting, as shown in FIG. 3, the modified fibre carrier assembly 3, which forms the optical component to be fixed, is gripped in a clamp 30, and held over the laser submount 2. In this example, the clamp 30 grips the metallised ends 23 of the chip resistor 20, and also in this case performs the additional function of allowing electrical contact to be made with the resistor. This may be by way of special conductive paths 31, as illustrated, or alternatively, the two jaws of such a clamp, suitably insulated from one another may be direct electrical conductors themselves. By passing an electrical current via the conductive paths 31 through the chip resistor the temperature of the fibre carrier assembly 3 alone is raised to above the melting point of the solder 17.

Although it is no longer essential, some background heating of the submount 2 is still preferable. As before, the submount may be placed on a heating platform (not shown), and its temperature raised, this time to just below the solder melting point. The incremental heat which the dedicated heating element 20 will need to supply is thereby reduced. Potentially damaging stresses induced by differential thermal contraction between submount 14 and fibre carrier 3 on cooling are also thereby limited.

The carrier assembly 3 is then lowered onto the solder 17. The heat from the chip resistor then melts the solder locally. During this process the solder conducts heat away from the fibre carrier, and to achieve even the very localised melting needed for mounting by this method, it is normally necessary to increase the current through the resistor at this stage. However, any current changes must be made with care to avoid burning out the resistor, for example, as the rate of thermal dissipation alters. Precise control and monitoring of the component temperature is therefore desirable, and may be achieved by a method which is described later.

When a satisfactory local melt is achieved, the fibre may then be moved to obtain the required correct alignment of fibre end 11 with the lasing facet of the laser 13. Alignment may be made either by using a conventional technique or, when appropriate, the improved method explained in detail below. The current through the heating element 20 is then reduced to allow the solder 17 to solidify and fix the fibre and carrier 3 onto the submount. The component may then be released from the clamp 30 and the temperature of the heating platform, if used, returned to normal.

Figure 4:
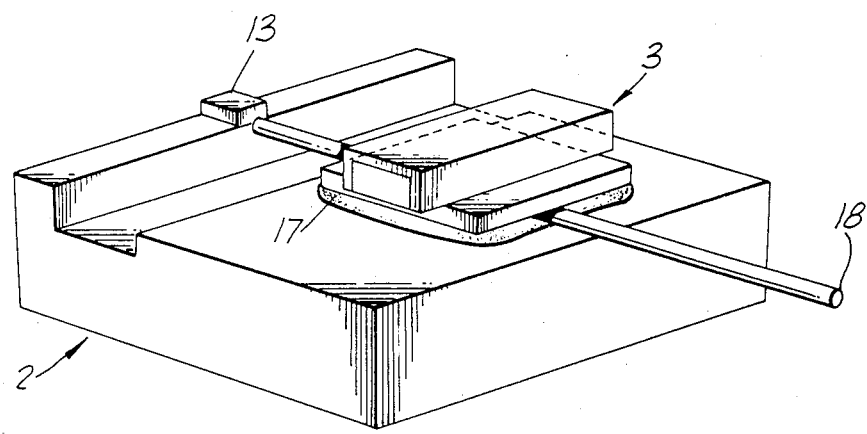
FIG. 4 shows, again in schematic, the final arrangement after mounting.

The completed assembly is shown in FIG. 4.

If other components were to be mounted onto the same substrate, each component could be mounted in like fashion. In this event, the substrate background temperature, being below the solder melting point, need not be lowered to normal until all of the components were mounted.

Although the invention has been described, by way of example, with reference to mounting an optical fibre carrier assembly on a laser submount, the invention in its main aspects has general application, both to the modification of other optical components, for example lenses, and to the mounting of such appropriately adapted optical components.

The heating element, shown as a chip resistor in the above example, may also be provided in alternative forms. For instance, a layer of conductive ink or other conductive material could be printed directly onto a suitably insulated component surface. Such insulation would be essential where the body of the component (eg. fibre carrier) might otherwise short circuit the heating element current path. The printing of such layers onto substrates may be done by the same methods as are used in the fabrication of thick film hybrid circuits or chip resistors.

As noted earlier, precise control of component temperature during the mounting process is desirable. The use of a resistive heating element (with a suitable temperature response) allows this to be done in a simple and convenient manner, without the need for a separate temperature sensor. The electrical resistance of most materials is a function of temperature. Although efforts are usually made in resistor construction to minimise this dependence, it is still present and can be used to provide a measure of the actual temperature of the resistor. It is merely necessary to employ suitable known circuitry to measure the resistance of the resistive heating element as it is heated. The heating current passing through the resistor may then be controlled to achieve the required temperature. FIG. 5 is a graph of the variation of resistance with temperature of an ink film resistor of the type described in the foregoing discussion. Of course, if preferred, resistors having a greater thermal variation of resistance than that shown could be used.

For achieving accurate component alignment in the particular case of an optical fibre and a semiconductor laser, the conventional technique mentioned earlier has some disadvantages.

As the temperature is raised, the optical output from a laser decreases sharply. At soldering temperatures, where lasing is not possible at all, output is limited to very low power spontaneous emission. High peak pulsed currents are needed even to obtain these emissions. Although operated on low duty cycles, under such conditions device reliability can be adversely affected. Additionally, alignment made using spontaneous emission may not be correct for lasing operation at normal temperatures.

The use of flat ended optical fibres which permit fairly large misalignment tolerances (of the order of $\pm 1$ $\mu$m), can reduce the likelihood of a problem arising from this latter possibility, but at the expense of reduced overall optical coupling efficiency. Where increased optical coupling efficiency is demanded, the relative positioning of the fibre and the lasing facet is much more critical, and alignment tolerances to better than $\pm 0.5$ $\mu$m, or even $\pm 0.2$ $\mu$m, are then needed.

It is an advantage of the present invention that the conditions under which the laser operates need not be as severe as previously, since the background temperature need not be as high, and the soldering heat is localised.

However, an improved alignment method disclosed below eliminates the requirement to pulse the laser at all, thus substantially reducing the risk of damage.

More advanced semiconductor lasers now being produced generally incorporate means of current confinement in their structures to enhance the lasing performance. As a consequence, such lasers are also only sensitive to injected light, which may induce a photocurrent in a passive (ie. not lasing) laser, in the immediate vicinity of the emitting region of the laser facet. In these lasers the area of maximum photosensitivity may thus conveniently coincide or be close to the area of maximum lasing output. This property may therefore allow laser to fibre alignment to be achieved at high temperatures without the need to pulse drive the laser.

Referring again to FIG. 3, in the improved alignment technique, whilst the solder 17 is still molten, light from a source 32 at the remote end 18 of the fibre 10 is coupled into the fibre. The photocurrent induced in the laser 13 (acting as a photodetector), by the light emerging from the end 11 of the fibre, is measured (eg. with a picoammeter), and the fibre is then positioned to maximise this current. For a laser with lasing maximum and photocurrent maximum coincident, as with most newer laser structures, for example, the fibre can be fixed at that position. Otherwise, the offset of lasing and photocurrent maxima must first be determined. Conveniently, this may be done by making preliminary measurements at room temperature, before starting the mounting procedure, when the laser can lase without detriment, and any offset between lasing and photocurrent maxima can be easily determined. Subsequently, during the mounting process, the offset is taken into account and the fibre fixed with a corresponding displacement from the photocurrent maximum.

It should be observed that some lasers, notably older types of stripe laser, which are sensitive to injected light over essentially the whole length of the laser facet, such that no unique photocurrent maximum is identifiable, cannot be aligned by this technique.

I claim:

1. A method of mounting an optical component on a substrate, the method comprising the steps of:
    (a) fixing the optical component to a carrier plate;
    (b) providing the carrier plate with dedicated heating means comprising a miniature resistor fixed to the carrier plate;
    (c) providing a localized heating effect to the carrier plate with said miniature resistor; and
    (d) fixing the carrier plate to the substrate with solder, wherein the carrier plate and solder are heated locally by the dedicated heating means.

2. A method of mounting according to claim 1, further comprising the steps of providing an additional optical device for mounting on said substrate; and aligning said optical component with said additional optical device.

3. A method according to claim 1, wherein the temperature of the heating means is electrically controlled.

4. A method according to claim 3, wherein the miniature resistor comprising the dedicated heating means is formed by deposition of a resistive ink film on a suitably insulated surface of the carrier plate.

5. A method according to claim 1, wherein the miniature resistor is a chip resistor.

6. A method according to claim 1, wherein, prior to step (d), the substrate to which the carrier plate is to be fixed is independently raised to a temperature just below, the melting point of the solder used for fixing the carrier plate to the substrate.

7. A method according to claim 2, wherein the optical component is an optical fibre and said additional optical device is a semiconductor laser, and wherein said aligning step comprises aligning the optical fibre with the semiconductor laser on a laser submount, and wherein the fibre is aligned using the laser as a photodetector.

8. An optical assembly comprising an optical component fixed to a carrier plate which is mounted on a substrate, wherein the carrier plate includes dedicated heating means comprising a miniature resistor to facilitate solder mounting of the carrier plate on the substrate by providing a localized heating effect to the carrier plate.

9. An assembly according to claim 8, wherein the miniature resistor comprises a resistive ink film deposited on a suitably insulated surface of the carrier plate.

10. An optical arrangement comprising a plurality of optical components mounted on a substrate, each of said optical components being fixed to a respective carrier plate, and each carrier plate including a respective dedicated heating means comprising a miniature resistor to facilitate solder mounting of that carrier plate on the substrate by providing a localized heating effect to the carrier plate.

11. An arrangement according to claim 10, wherein the substrate comprises a semiconductor laser submount, and wherein each of said optical components is an optical fibre.

12. A method of mounting an optical fibre on a substrate in alignment with a semiconductor laser, the method comprising the steps of:
    (a) fixing the optical fibre to a carrier plate;
    (b) providing the carrier plate with dedicated heating means comprising a miniature resistor fixed to the carrier plate for providing a localized heating effect to the carrier plate;

(c) fixing the carrier plate to the substrate with solder; and (d) aligning the optical fibre with the laser, when the solder is in the molten state by using the laser as a photodetector;

wherein the carrier plate and the solder are heated locally by the dedicated heating means.

13. A method of mounting an optical component on a substrate using solder, the method comprising the steps of:

(a) fixing the optical component to a carrier plate;

(b) providing the carrier plate with dedicated heating means comprising a miniature resistor fixed to the carrier plate for providing a localized heating effect to the carrier plate;

(c) independently heating the substrate to which the component is to be fixed to a temperature just below, the melting point of the solder to be used to fix the carrier plate to the substrate; and (d) fixing the carrier plated to the substrate with solder;

wherein the carrier plate and solder are heated locally by the dedicated heating means.

* * * * *